United States Patent [19]

Polonio et al.

[11] Patent Number: 4,908,621

[45] Date of Patent: Mar. 13, 1990

[54] AUTOCALIBRATED MULTISTAGE A/D CONVERTER

[75] Inventors: John D. Polonio, Beaverton; Bruce J. Penney, Portland; John Lewis, Tigard, all of Oreg.

[73] Assignee: Tektronix, Inc., Beaverton, Oreg.

[21] Appl. No.: 215,667

[22] Filed: Jul. 6, 1988

[51] Int. Cl.$^4$ .............................................. H03M 1/06
[52] U.S. Cl. .................................... 341/120; 341/118; 341/156; 341/161
[58] Field of Search ............... 341/118, 120, 121, 126, 341/128, 129, 138, 139, 142, 155, 156, 158, 159, 160, 161, 162, 163

[56] References Cited

U.S. PATENT DOCUMENTS

| | | | |
|---|---|---|---|
| 3,646,548 | 2/1972 | Van Doren | 341/138 |
| 3,967,269 | 6/1976 | Fletcher | 341/156 |
| 4,373,189 | 2/1983 | Weant | 341/139 |
| 4,490,713 | 12/1984 | Mrozowski et al. | 341/163 |
| 4,535,319 | 8/1985 | Penney | 341/156 |
| 4,612,533 | 9/1986 | Evans | 341/156 |
| 4,736,189 | 4/1988 | Katsumata et al. | 341/155 |
| 4,749,984 | 6/1988 | Prost et al. | 341/156 |
| 4,788,696 | 11/1988 | Sakane et al. | 341/155 |

OTHER PUBLICATIONS

H-P Journal, Nov. '82, Muto et al., "Designing a Ten-Bit, Twenty-Megasample-Per-Second Analog-to-Digital Converter System".
WESCON/82, 30/1, Sep. 14-16, '82, Kauffman, "Multistage Error Correcting A/D Converters".

*Primary Examiner*—William M. Shoop, Jr.
*Assistant Examiner*—H. L. Williams
*Attorney, Agent, or Firm*—Francis I. Gray; Peter J. Meza

[57] ABSTRACT

An autocalibrated multistage analog to digital converter precisely maintains appropriate error correction levels for each stage during operation of the converter to minimize quantization errors. An error signal is derived from the digital output of the converter based upon the slope of the input analog signal, determined either explicitly via hardware or implicitly via software, and an overflow/underflow condition. The error signal is fed back to a calibration control circuit to generate individual error correction levels for various variable correction devices within the analog to digital converter, such as a variable analog delay device. The variations from nominal established at calibration that are due to age, temperature or other environmental factors generate the error signal that varies from a nominal value and is fed back to alter the various error correction levels to minimize the error variation.

6 Claims, 2 Drawing Sheets

AUTOCALIBRATED MULTISTAGE A/D CONVERTER

BACKGROUND OF THE INVENTION

The present invention relates to analog to digital conversion circuits, and more particularly to an autocalibrated multistage A/D converter that maintains appropriate error correction levels for each stage during operation of the converter after being initially set at calibration to minimize quantization errors.

High speed analog to digital converters (ADC) that encode or digitize continuously are usually of the "flash" or all-parallel design. These converters represent a brute force approach to very high speed conversion since they require a comparator, voltage reference and digital translation for every quantization level. Therefore multistage converters, such as the dual-stage flash A/D converter disclosed in U.S. Pat. No. 4,535,319 issued Aug. 13, 1985 to Bruce J. Penney or the three stage ADC disclosed in WESCON/82 Professional Program Session Record 30 by Sid Kauffman, are used to provide high resolution with far fewer elements with a tradeoff in conversion speed. A basic multistage ADC has a first quantizer to which is input an analog signal to be digitized, a digital to analog converter (DAC) to convert the output of the first quantizer to an equivalent analog signal, means for subtracting the equivalent analog signal from the input analog signal to produce a difference signal, a second quantizer to which is input the difference signal, a second DAC and means for subtracting the output of the second DAC from the difference signal to produce a second difference signal, a third quantizer to which is input the second difference signal, etc. A digital correction circuit receives the outputs of the quantizers to produce a final output digital value corresponding to the input analog signal.

Timing is usually provided by a timing circuit which generates strobe pulses for the various circuit components, each strobe pulse having a fixed time relationship with a reference strobe pulse. For precision conversion the phase of each strobe signal has to be maintained constant during operation of the ADC. Other internal quantization problems that arise in the operation of the multistage ADC include first quantizer gain, offset or linearity errors, digital to analog gain or offset errors and limiter amplifier offset errors. Typically the phases of the strobe pulses and other error correction levels are set at calibration, but they tend to drift with component aging, temperature and other environmental effects, resulting in quantization errors in the output of the ADC.

What is desired is a means for maintaining proper error correction levels for multiple stages of a multistage ADC during operation of the converter to minimize quantization errors due to component aging, temperature and other environmental effects.

SUMMARY OF THE INVENTION

Accordingly the present invention provides an autocalibrated multistage analog to digital converter that maintains appropriate error correction levels for each stage during operation of the converter to minimize quantization errors. An error detecting/correcting feedback loop is incorporated into a conventional multistage ADC. An error detection circuit compares a current digital output value with an immediately preceding digital output value to determine the presence of a slope in an input analog signal and the direction of the slope. Also an error detection signal is generated for overflow/underflow conditions. The slope information and the error detection signal are used to generate an error signal that is input to a dedicated logic or microprocessor calibration control circuit. The output of the calibration control circuit is a plurality of error correction words that are output onto a bus to which are coupled a plurality of digital to analog converters. The output of each DAC provides an error correction level to an error correction device within the ADC, such as to a variable analog delay device to which is input a reference strobe pulse. The delayed strobe pulse output of the analog delay device regulates the sample time of the data for a quantizer stage to minimize the error signal and maintain a precise phase relationship. Likewise other error correction levels are regulated to control gain, offset and other types of errors.

Alternatively, rather than explicitly determining the slope using hardware, the slope can be determined implicitly using software by adjusting the error correction word values in one direction and observing the error signal, reversing the adjustment direction if the error signal increases.

The objects, advantages and novel features of the present invention are apparent from the following detailed description when read in conjunction with the appended claims and attached drawing.

DESCRIPTION OF THE PREFERRED EMBODIMENT

Figure 1:
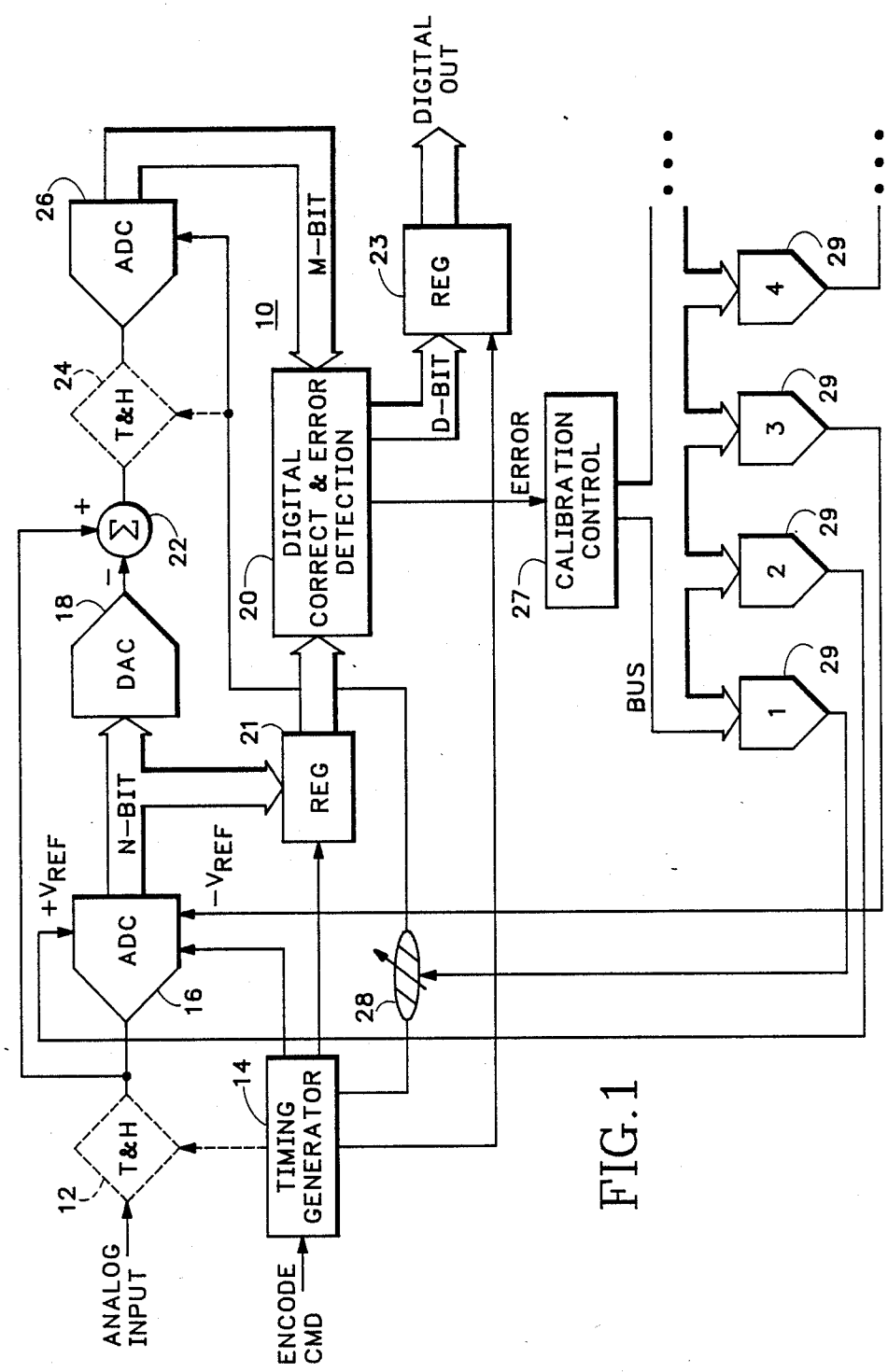
FIG. 1 is a block diagram of a dual-stage flash analog to digital converter incorporating an autocalibrated, correction according to the present invention.

Referring now to FIG. 1 a conventional dual-stage flash analog to digital converter (ADC) 10 is shown having an analog input signal to be converted. The analog input signal is input to a first flash quantizer 16 to produce a coarse N-bit quantized digital output. The N-bit digital output is input to a digital to analog converter (DAC) 18 and to a digital correction/error detection circuit 20 via a first register 21. The analog output of the DAC 18 and the sampled analog input signal are summed at node 22 to produce a difference analog input signal. The difference analog input signal is input to a second to a second flash quantizer 26 and converted into an M-bit quantized digital output. The M-bit digital output also is input to the digital correction/error detection circuit 20. The error detection circuit 20 outputs a D-bit quantized digital output signal via a second register 23, corresponding to the analog input signal, and an error signal. The error signal is fed back via a calibration control circuit 27 and respective DACs 29 to various variable error correction devices, such as to a variable analog delay device 28 that delays a first strobe pulse. The first strobe pulse is used by the second flash quantizer 26 to sample the difference analog input signal. The strobe pulses for the various components of the ADC 10 are derived from a timing generator 14 that assures the proper timing at various points in the ADC when initiated by an encode command and are established by techniques well known in the art.

Also optional track and hold circuits 12, 24 may be inserted prior to each quantizer 16, 26, respectively, as is well known in the art.

Figure 2:
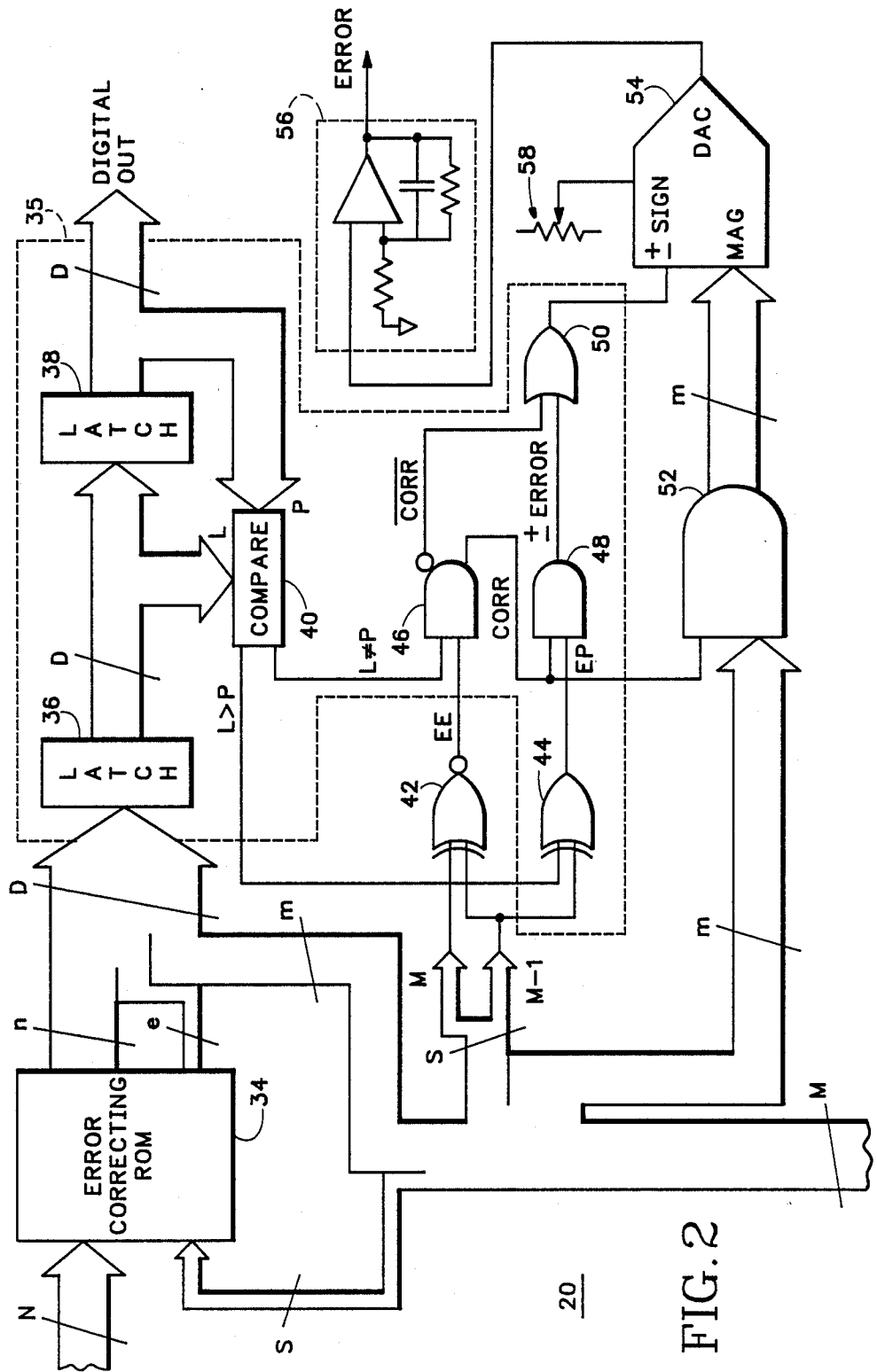
FIG. 2 is a block diagram of an error detection circuit for the dual-stage flash analog to digital converter of FIG. 1 according to the present invention.

An embodiment for the error detection circuit 20 is shown in greater detail in FIG. 2. The N-bit digital output from the first flash quantizer 16 is input to a digital correction circuit 34, such as a read only memory (ROM), together with sign bits, s, from the M-bit digital output from the second flash ADC 26. The corrected output from the ROM 34, having n bits from the N-bit digital output and e bits from the sign bits are combined with the remaining m bits from the M-bit digital output to form a D-bit digital word that is stored in a first latch 36 that is part of a slope determination circuit 35. The contents of the first latch 36 are subsequently transferred to a second latch 38 when a new D-bit digital word is loaded into the first latch. The D-bit digital words from the second latch 38 form the D-bit digital output of the ADC 10. The contents of the latches 36, 38, being a current converted sample L and an immediately prior converted sample P, are compared in a comparator circuit 40 to determine whether a slope in the analog input signal is present ($L \neq P$) and the direction of the slope ($L > P$), if any. The sign bits, s, indicate an overflow/underflow condition and are input separately to an exclusive NOR circuit 42 to provide a signal, EE, indicative of such condition. One of the sign bits also is input to an exclusive OR circuit 44 together with the slope direction indication, $L > P$, to provide an error polarity signal, EP.

An AND circuit 46 having a differential output, CORR and /CORR, is enabled by the slope present indicator, $L \neq P$, to provide a correction signal, CORR, when there is a slope and EE indicates an overflow/underflow condition. CORR enables a second AND circuit 48 to pass the error polarity signal, EP, to an OR circuit 50. Also input to the OR circuit 50 is /CORR from AND circuit 46. CORR further enables a data circuit 52 to pass the m quantization error bits to a DAC 54 together with the output of the OR circuit 50 as a sign bit. The output of the DAC 54 is input to an integrating loop gain amplifier 56 to provide the error signal to the calibration control circuit 27. The loop gain and integration time constant of the integration amplifier 56 are determined to ensure compatibility with the application intended for the ADC 10.

Referring to Table I below the error zones for the M-bit digital output of the second quantizer 26 are shown:

TABLE I

| M | M-1 | m-bits | | | | | |
|---|-----|--------|---|---|---|---|---|
| 1 | 1 | x | x | x | x | x | + Error Range |
| 1 | 0 | x | x | x | x | x | No Error Range |
| 0 | 1 | x | x | x | x | x | No Error Range |
| 0 | 0 | x | x | x | x | x | − Error Range |

The error range information, EE, from Table I, and the relationship of the slope of the analog input signal as implemented by the logic circuit of FIG. 2, including the exclusive NOR and OR circuits 42, 44, the AND circuits 46, 48 and the OR circuit 50, is indicated by Table II below for controlling the variable delay line 28:

TABLE II

| | | SLOPE | | |
|---|---|---|---|---|
| | | Positive Slope | Negative Slope | No Slope |
| E R R O R | + ERROR Range | Decrease Delay | Increase Delay | Hold Delay |
| | − ERROR Range | Increase Delay | Decrease Delay | Hold Delay |
| | No ERROR Range | Hold Delay | Hold Delay | Hold Delay |

Thus in this example the most significant bits of the M-bit digital output determine whether the M-bit digital output is within either the + or − error ranges, representing the EE signal being "1" when the M and M−1 bits are both "1" or both "0". The m bits when the EE signal is "1" are the error magnitude bits. In the no error range CORR is "0" so that zeros are passed to the DAC 54 instead of the m bits via AND circuit 52. In this situation the output of the DAC 54 is equal to the value set by an offset calibration adjustment, represented by variable resistor 58. Thus the nominal settings for the error correction levels from the calibration control circuit 27 are established by the bias value of the error signal at the time of initial phase calibration using the offset calibration adjustment 58. Referring to Table II the error range indication and the slope indication are combined such that, when not in an error range or when there is no slope in the analog input signal, the delay of the variable analog delay device 28 or other error correction level for other variable correction devices is held constant as determined by the bias value(s); when in the +error range and with a positive slope ($L > P = 1$) the delay or error correction level is decreased, and with a negative slope ($L > P = 0$) the delay or error correction level is increased; and when in the −error range and with a positive slope the delay or error correction level is increased, and with a negative slope the delay or error correction level is decreased.

Alternatively when the calibration control circuit 27 uses a microprocessor, then the hardware forming the slope determining circuit 35 may be omitted and EE from the exclusive NOR circuit 42 may be input to enable the data circuit 52 to directly control the DAC 54. In this alternative embodiment the microprocessor, as part of the calibration control circuit 27, adjusts the values of the error correction words for each controlled device according to respective software algorithms and the observed effect of the error signal. If the error signal increases, then the direction of the adjustment is reversed to minimize all errors. This is equivalent to implicitly determining the slope of the signal without the hardware described above.

In operation the ADC 10 is initially calibrated by inputting a known signal that thoroughly exercises all quantization levels of the ADC. The error signal generated at the output of the digital correction/error detection circuit 20 is analyzed by the calibration control circuit 27 and signals are output in turn to each variable correction device controlled by the respective DACs 29. Since each type of ADC error is independent of the others, each variable correction device may be adjusted individually to determine when there is a minimum in the error signal. When a microprocessor is used in the calibration control circuit 27, these calibration values may be stored in microprocessor memory as nominal values during operation of the ADC. During operation of the ADC as components age, temperature varies or other environmental factors affect the operation of the ADC, the error signal from the digital correction/error detection circuit varies from nominal. This variation may be fed back to the microprocessor within the calibration control circuit 27 which in turn adjusts the various variable correction devices to maintain precise operation of the ADC.

Thus the present invention provides an autocalibrated multistage analog to digital converter that precisely maintains the error correction levels for each stage during operation of the converter by generating an error signal from the digital outputs of prior converter stages that is fed back via a calibration control circuit to adjust various variable correction devices to minimize quantization errors.

What is claimed is:

1. An improved multistage analog to digital converter of the type having a plurality of analog to digital converter stages such that the output of the digital to analog converter stage is subtracted from the analog input to the prior analog to digital converter stage prior to input to the subsequent analog to digital converter stage, the outputs of the analog to digital converter stages being converted to a digital output corresponding to an analog signal input to the first analog to digital converter stage, wherein the improvement comprises:
   means for comparing a current output digital signal derived from the analog to digital converter with an immediately preceding output digital signal to produce a slope indicator;
   means for generating an out of range indicator from the most significant bits of the digital output of one of the analog to digital converter stages;
   means for combining the slope indicator, the out of range indicator and the remaining bits of the digital output of the one analog to digital converter stage to produce an error signal; and
   means for varying error correction levels for each of a plurality of variable correction devices for each analog to digital converter stage in response to the error signal such that the quantization error is minimized during operation of the analog to digital converter.

2. An improved analog to digital converter as recited in claim 1 wherein the comparing means comprises:
   a first latch for storing the current output digital signal;
   a second latch for storing the immediately preceding output digital signal, the input of the second latch being coupled to the output of the first latch; and
   a comparator coupled to the outputs of the first and second latches to provide the slop indicator based upon the contents of the first and second latches.

3. An improved analog to digital converter as recited in claim 1 wherein the out of range indicator generating means comprises an exclusive NOR circuit to which the most significant bits of the output digital signal from one analog to digital converter stage are input to produce an output when the most significant bits are all the same.

4. An improved analog to digital converter as recited in claim 1 wherein the combining means comprises:
   means for deriving from the slope indicator signal and the out of range error indicator a correction signal;
   means for deriving from one of the most significant bits of the output digital signal from the one analog to digital converter stage and from the slope indicator an error polarity signal;
   means for generating a sign bit from the error polarity signal and the correction signal; and
   means for generating a digital error signal from the remaining bits of the output digital signal from the one analog to digital converter stage and the sign bit.

5. An improved analog to digital converter as recited in claim 4 wherein the combining means further comprises means for converting the digital error signal into the error signal.

6. An improved analog to digital converter as recited in claim 5 wherein the converting means comprises:
   a digital to analog converter having an initial bias output value to which the digital error signal and the sign bit are input to increase/decrease the initial bias output value to produce an error output value; and
   means for integrating the error output value to produce the error signal.

* * * * *